(12) United States Patent
Mears

(10) Patent No.: US 6,787,068 B1
(45) Date of Patent: Sep. 7, 2004

(54) CONDUCTOR COMPOSITION

(75) Inventor: Sarah Jane Mears, Bristol (GB)

(73) Assignee: E. I. du Pont de Nemours and Company, Wilmington, DE (US)

( * ) Notice: Subject to any disclaimer, the term of this patent is extended or adjusted under 35 U.S.C. 154(b) by 272 days.

(21) Appl. No.: 10/070,905

(22) PCT Filed: Oct. 5, 2000

(86) PCT No.: PCT/US00/27415
§ 371 (c)(1),
(2), (4) Date: Mar. 7, 2002

(87) PCT Pub. No.: WO01/27941
PCT Pub. Date: Apr. 19, 2001

(30) Foreign Application Priority Data

Oct. 8, 1999 (GB) .............................................. 9923882

(51) Int. Cl.$^7$ .............................. H01B 1/02; H01B 1/16
(52) U.S. Cl. ........................ 252/512; 252/520.1; 427/96
(58) Field of Search ............................. 252/512, 520.1; 427/96

(56) References Cited

U.S. PATENT DOCUMENTS

| 3,915,721 A | * | 10/1975 | Kamigaito et al. | ...... 252/520.1 |
| 4,215,020 A | * | 7/1980 | Wahlers et al. | ........ 252/519.54 |
| 4,434,084 A | * | 2/1984 | Hicks et al. | ................. 252/512 |
| 4,651,126 A | * | 3/1987 | Kumar et al. | ............... 338/309 |

FOREIGN PATENT DOCUMENTS

| EP | 0146120 A2 | 6/1985 |
| EP | 0257193 A | 3/1988 |
| EP | 0529298 A2 | 3/1993 |
| GB | 1053331 A | 12/1966 |
| JP | 550158114 A | 12/1980 |
| JP | 570063365 A | 4/1982 |
| JP | 61066303 A | 4/1986 |
| JP | 030225787 A | 10/1991 |

* cited by examiner

Primary Examiner—Mark Kopec

(57) ABSTRACT

A composition comprising finely divided particles of (a) an electrically-conductive material; (b) one or more inorganic binders; and (c) tin, wherein components (a), (b) and (c) are in a liquid vehicle, said composition being suitable for use in the manufacture of an electrically-conductive pattern on a substrate.

12 Claims, No Drawings

CONDUCTOR COMPOSITION

The present invention relates to conductor compositions and their use in the manufacture of components, particularly heating elements, in microelectronic circuits. These compositions are of particular use in the manufacture of demisting elements in heated windows, for example in automotive glazing, particularly automotive backlights.

The use of thick-film conductors as components in hybrid microelectronic circuits is well known in the electronics field. Compositions for the manufacture of such components usually take the form of a paste-like solid-liquid dispersion, where the solid phase comprises finely divided particles of a noble metal or a noble metal alloy or mixtures thereof and an inorganic binder. The liquid vehicle for the dispersion is typically an organic liquid medium, but may also be an aqueous-based liquid medium. Additional materials may be added in small quantities (generally less than about 3% by weight of the composition) to modify the properties of the composition and these include staining agents, rheology modifiers, adhesion enhancers and sintering modifiers.

The metals used in the preparation of thick-film conductor compositions are typically selected from silver, gold, platinum and palladium. The metal can be used either in isolation or as a mixture which forms an alloy upon firing. Common metal mixtures include platinum/gold, palladium/silver, platinum/silver, platinum/palladium/gold and platinum/palladium/silver. The most common systems used in the manufacture of heating elements are silver and silver/palladium. The inorganic binder is typically a glass or glass-forming material, such as a lead silicate, and functions as a binder both within the composition and between the composition and substrate onto which the composition is coated. Due to environmental considerations the use of lead-containing binders is becoming less common and lead-free binders such as zinc or bismuth borosilicates are now often employed. The role of the organic medium is to disperse the particulate components and to facilitate the transfer of the composition onto the substrate.

The consistency and rheology of the composition is adjusted to the particular method of application which may comprise screen printing, brushing, dipping, extrusion, spraying and the like. Typically, screen printing is used to apply the composition. The pastes are usually applied to an inert substrate, such as an alumina, glass, ceramic, enamel, enamel-coated glass or metal substrate, to form a patterned layer. The thick-film conductor layer is normally dried and then fired, usually at temperatures between about 600 and 900° C., to volatilise or burn off the liquid vehicle and sinter or melt the inorganic binder and the metal components. Direct wet-firing, i.e. wherein the thick film layer is not dried before fig, has also been used to generate the patterned layer.

It is, of course, necessary to connect the conductive pattern to the other components of the electronic circuit, such as the power source, resistor and capacitor networks, resistors, trim potentiometers, chip resistors and chip carriers. This is generally achieved by using metal clips, typically comprising copper, which are soldered either directly adjacent to or on top of the conductive layer. Where the clips are soldered on top of the conductive layer, attachment is either directly onto the conductive pattern itself or onto a solderable composition which is overprinted onto the pattern (an "over-print"). An over-print is generally applied only in the region of the conductive pattern to which the metal clips are attached by solder, which region is generally referred to as the "clip area". The ability to solder onto the electrically-conductive layer is an important parameter in the manufacture of heating elements since it removes the requirement for an over-print. However, the inorganic binder, which is important for binding the paste onto the substrate, can interfere with solder wetting and result in poor adhesion of the soldered metal clips to the conductive layer. The requirements of high substrate adhesion and high solderability (or adhesion of the metal clips to the conductive pattern) are often difficult to meet simultaneously. U.S. Pat. No. 5,518,663 provides one solution to this problem by incorporating into the composition a crystalline material from the feldspar family.

An important application of patterned electrically-conductive layers is in the automobile industry, and particularly in the manufacture of windows which can be defrosted and/or demisted by an electrically-conductive grid permanently attached to the window and capable of producing heat when powered by a voltage source. In order for the window to defrost quickly, the circuit must be capable of supplying large amounts of power from a low voltage power source, typically 12 volts. For such power sources the resistivity requirement of the conductive pattern is generally in the range of from about 2 to about 5 $\mu\Omega$ cm (5 m$\Omega$/□ at 10 $\mu$m after firing). This requirement is readily met by conductors containing noble metals, particularly silver which is the most commonly-used material for this application.

In certain applications, a conductive composition having a higher resistivity is required. In particular, it is anticipated that the resistance requirements of window-heating elements in automobiles will shortly need to change since the automotive industry is expected to adopt the use of a 42 and 48 volt power supply in the near future. As a result, the conductive composition used to manufacture the window-heating elements will be required to exhibit higher values of resistivity, typically greater than about 10 $\mu\Omega$ cm, preferably greater than about 12 $\mu\Omega$ cm, particularly in the range from about 20 to about 70 $\mu\Omega$ cm.

A number of different materials may be added to adjust the specific resistivity of a conductive composition. For example, metal resinates such as rhodium and manganese resinates have been used to increase resistivity, as disclosed in U.S. Pat. No. 5,162,062 and U.S. Pat. No. 5,378,408. In addition, an increase in the content of precious metals, particularly the platinum group metals such as platinum and palladium, has also been used to increase the specific resistivity. Silver/palladium and silver/platinum compositions can achieve resistivity values from about 2 $\mu\Omega$ cm (that of a composition comprising only silver and binder) up to around 100 $\mu\Omega$ cm (for a 70:30 Pd:Ag blend). Systems comprising platinum and/or palladium are, however, significantly more expensive and their use would be prohibitive in applications requiring coverage of a large surface area, such as the window-heating elements used in the automotive industry. In addition, an over-print of a composition containing a high amount of silver (and typically small amounts of filler) is generally required for certain metal blends, such as compositions containing high palladium levels, in order to achieve adequate solder adhesion. Conventional conductive compositions which typically operate at resistivity values of 2 to 5 $\mu\Omega$ cm and which are comprised predominantly of silver do not require an over-print since acceptable levels of solder adhesion can be achieved by adjusting the levels of inorganic binder.

Other, lower-cost approaches for achieving a high resistivity involve blending large amounts of filler into a silver-containing conductive composition to block the conductive path. Fillers are typically inorganic materials and those commonly used are glass (which may be the same or different as that used for the binder) and alumina (or other metal oxides). However, such approaches tend to result in a loss of solder acceptance and solder adhesion. For example, adequate solder adhesion can be maintained only up to a level of about 10% alumina by weight of the composition but this level is generally too low for an appreciable rise in resistivity. For glass-type fillers, loss of solder adhesion occurs at even lower levels and, again, this level is too low for an appreciable rise in resistivity. In addition, this problem can not normally be ameliorated by the use of silver over-prints owing to glass migration between the layers during firing, specifically from the conductive coating into the over-print.

A further requirement of the conductor compositions is that they must be chemically durable and resilient to exposure to varying environmental conditions such as temperature, humidity, acid and salt. Compositions comprising large amounts of glass filler, particularly lead-free glass filler, are often relatively unstable to such factors.

An additional consideration is that it is desirable for the resistance of the coating composition to be substantially independent of the temperature of firing used in the manufacture of the patterned conductive layer. For instance, in the case of the application of a conductive composition to a glass substrate, the behaviour of the composition under sintering and melting should remain substantially constant between the temperatures of about 620 and 680° C. Nevertheless, a change in resistance of up to about 10% between these two temperatures, which corresponds to the behaviour of a pure silver composition, is generally tolerated. The use of large amounts of filler to significantly increase resistivity results in compositions which do not generally satisfy this requirement A further additional consideration is that it is desirable for the relationship between the resistivity and the amount of resistivity modifier added to the composition to be relatively predictable and/or substantially linear within the target range of desired resistivities. The resistivity of compositions comprising large amounts of filler generally increases in an almost linear manner until a critical concentration is reached. At this critical concentration, the resistivity may rise very rapidly, often by an order of magnitude, when the level of resistivity modifier is increased by only a fraction of a weight percent. As a result, it is difficult to target specific values of resistivity for such compositions.

It is an object of this invention to provide higher-resistivity electrically-conductive compositions which do not suffer from the afore-mentioned disadvantages. In particular, it is an object of this invention to provide an economical electrically-conductive coating composition having increased resistivity while at the same time exhibiting good solderability.

Accordingly, the present invention provides a composition comprising finely divided particles of (a) an electrically-conductive material; (b) one or more inorganic binders; and (c) tin, wherein components (a), (b) and (c) are dispersed in a liquid vehicle, preferably an organic medium.

The composition of the present invention preferably exhibit higher values of resistivity of greater than about 10 $\mu\Omega$ cm, preferably greater than about 12 $\mu\Omega$ cm, preferably in the range from about 20 to about 70 $\mu\Omega$ cm, and more preferably in the range from about 20 to about 50 $\mu\Omega$ cm. In one embodiment, the resistivity is in the range from about 30 to about 40 $\mu\Omega$ cm.

The compositions of the present invention are suitable for use as paste compositions for forming thick-film conductive patterns on a substrate, for instance, by the process of screen-printing. The compositions of the present invention are of particular use as components in the manufacture of windows which can be defrosted and/or demisted by an electrically-conductive grid attached to the window, particularly for use in the automotive industry.

As used herein, the term "finely divided" is intended to mean that the particles are sufficiently fine to pass through a 400-mesh screen (US standard sieve scale). It is preferred that at least 50%, preferably at least 90%, and more preferably substantially all of the particles are in the size range of 0.01 to 20 $\mu$m. Preferably, the largest dimension of substantially all particles is no more than about 10 $\mu$m and desirably no more than about 5 $\mu$m.

Preferably, the components are present in amounts such that the total amount of components (a), (b) and (c) is about 50 to about 95% by weight of the composition, with the liquid vehicle being present in amounts of about 5 to about 50% by weight of the composition. In a preferred embodiment, the total amount of components (a), (b) and (c) is in the range from about 60 to about 90%, preferably from about 70 to about 85% by weight of the composition.

Compounds (a), (b) and (c) generally comprise substantially all of the solid phase material used to prepare the compositions of the invention. Preferably component (a) is present in amounts of from about 30 to about 99.4%, preferably from about 50 to about 98%, more preferably from about 60 to about 90%, and more preferably from about 65 to about 75%, by weight of the total solids present in the composition. Preferably component (b) is present in amounts of from about 0.5 to about 40%, preferably from about 2 to about 25%, by weight of the total solids present in the composition. In one embodiment, component (b) is present in amounts from about 10 to about 25% and more preferably from about 15 to about 25%, by weight of the total solids present in the composition. In an alternative embodiment, component (b) is present in amounts from about 2 to about 20% and more preferably from about 5 to about 15%, by weight of the total solids present in the composition. Preferably component (c) is present in amounts of about 0.1 to about 30%, preferably from about 2 to about 20%, more preferably from about 4 to about 16%, and more preferably from about 6 to about 12%, by weight of the total solids present in the composition.

The electrically-conductive particles of component (a) can be in any form suitable for the production of the compositions of the present invention. For example, electrically-conductive metallic particles may be in the form of either metal powders or metal flakes or blends thereof. In one embodiment of the invention, the metallic particles are a blend of powder and flake. The particle size of the metal powder or flake is not by itself narrowly critical in terms of technical effectiveness. However, particle size does affect the sintering characteristics of the metal in that large particles sinter at a lower rate than small particles. Blends of powders and/or flakes of differing size and/or proportion can be used to tailor the sintering characteristics of the conductor formulation during firing, as is well-known in the art. The metal particles should, however, be of a size that is appropriate to the method of application thereof, which is usually screen printing. The metal particles should therefore generally be no larger than about 20 $\mu$m in size and preferably less than about 10 $\mu$m. The minimum particle size is normally about 0.1 $\mu$m.

The preferred metal for the electrically-conductive component (a) of the conductor composition of the present invention is silver. Silver particles larger than about 1.0 $\mu$m impart greater colouring to the composition. It is preferred that the compositions of the invention contain at least 50% weight silver particles larger than 1.0 μm. The silver will ordinarily be of high purity, typically greater than 99% pure. However, less pure materials can be used depending on the electrical requirements of the conductive layer or pattern. In an embodiment of the invention, component (a) comprises a mixture of silver and nickel and/or suitable derivatives. A preferred nickel derivative suitable for use in this embodiment of the invention is nickel boride ($Ni_3B$). Typically, the Ag:Ni ratio will be about 1:1 to about 25:1, preferably at least about 1.5:1 and more preferably about 1.5:1 to about 3:1.

Component (c) in the compositions of the present invention comprises tin in one or more of the following forms:
(i) metallic tin particles;
(ii) particles of a tin-containing alloy;
(iii) a derivative of tin which is substantially converted to the metal under the action of heat.

Preferably, the particles of component (c) are metallic tin particles and/or particles of a tin-containing alloy. More preferably, the particles of component (c) are metallic tin particles. In the embodiment of the invention wherein component (c) comprises a tin-containing alloy, it is preferred that said alloy is a tin/silver alloy, particularly a eutectic tin/silver alloy, particularly a tin/silver alloy containing between about 94 and 99% and particularly about 97% by weight tin.

The size of the particles should generally be no larger than about 20 μm and preferably less than 10 μm. The minimum particle size is normally about 0.1 μm. The particles may be spherical or spheroid or irregular in shape, in the form of a flake or a powder, or in any other suitable morphology.

The use of metallic tin-containing particles as an additive according to the present invention provides compositions which exhibit (i) high resistivity; (ii) high solder adhesion; (iii) a more uniform rise in resistivity with increasing concentration of the additive in relation to compositions in which large amounts of filler are used to increase resistivity; and (iv) low variation of resistance with firing temperature. In addition, tin is a relatively inexpensive material and is an economical method of increasing resistivity.

Suitable inorganic binders for use in the present invention are those materials which upon sintering serve to bind the metal to a substrate such as a glass (including toughened and laminated glass), enamel, enamel-coated glass, ceramic, alumina or metal substrate. The inorganic binder, also known as a frit, comprises finely-divided particles and is a key component in the compositions of the present invention. The softening point and viscosity of the frit during firing, as well as its wetting characteristics for the metal powder/flake and the substrate, are very important factors. The particle size of the frit is not narrowly critical and frits useful in the present invention will typically have an average particle size from about 0.5 to about 4.5 μm, preferably from about 1 to about 3 μm.

It is preferred that the inorganic binder is a frit having a softening point of between about 350 and 620° C. in order that the compositions can be fired at the desired temperatures (typically 300 to 700° C., particularly 580 to 680° C.) to effect proper sintering, wetting and adhesion to the substrate, particularly a glass substrate. It is known that mixtures of high and low melting frits can be used to control the sintering characteristics of the conductive particles. In particular, it is believed that the high temperature frit dissolves in the lower melting frit and together they slow the sintering rate of the conductive particles as compared to pastes containing only low melting frit. This control of the sintering characteristics is especially advantageous when the composition is printed and fired over decorative enamels. (Decorative enamels are normally pastes comprised of one or more pigment oxides and opacifiers and glass frit dispersed in an organic medium.) A high melting frit is considered to be one having a softening point above 500° C. and a low melting frit is considered to be one having a softening point below 500° C. The difference in the melting temperatures of the high and low melting frits should be at least 100° C. and preferably at least 150° C. Mixtures of three or more frits having different melting temperatures can also be used. When mixtures of high and low melting frits are used in the invention, they are normally used in ratios by weight from 4:1 to 1:4.

As used herein, the term "softening point" refers to softening temperatures obtained by the fibre elongation method of ASTM C338-57.

Suitable binders include lead borates, lead silicates, lead borosilicates, cadmium borate, lead cadmium borosilicates, zinc borosilicates, sodium cadmium borosilicates, bismuth silicates, bismuth borosilicates, bismuth lead silicates and bismuth lead borosilicates. Typically, any glass having a high content of bismuth oxide, preferably at least 50% and more preferably at least 70% by weight bismuth oxide, is preferred. Lead oxide as a separate phase may also be added, if necessary. However, due to environmental considerations, lead-free binders are preferred. Examples of glass compositions (compositions A to I) are given in Table 1 below; the oxide components are given in weight percent.

TABLE 1

| Glass Compositions | | | | | | | | | |
|---|---|---|---|---|---|---|---|---|---|
| | A | B | C | D | E | F | G | H | I |
| $Bi_2O_3$ | 75.1 | 82.7 | | | 78.1 | 94.8 | 73.3 | 73.7 | 69.82 |
| PbO | 10.9 | 1.83 | 43.6 | 0.7 | | | | | |
| $B_2O_3$ | 1.2 | 1.34 | 4.8 | 26.7 | | | | | 8.38 |
| $SiO_2$ | 9.3 | 10.3 | 37.5 | 21.7 | 8.6 | 5.2 | 4.7 | 4.8 | 7.11 |
| CaO | 2.4 | 2.68 | 9.7 | 4.0 | | | | | 0.53 |
| BaO | | | | 0.9 | | | | | |
| ZnO | | | | 27.6 | 3.9 | | | 5.0 | 12.03 |
| CuO | | | | | 7.6 | | 5.5 | | |
| CoO | | | | | 1.8 | | | | |
| $Al_2O_3$ | 1.1 | 1.22 | 4.3 | 5.7 | | | | | 2.13 |
| $Na_2O$ | | | | 8.7 | | | | | |
| $ZrO_2$ | | | | 4.0 | | | | | |
| $GeO_2$ | | | | | | | 16.5 | 16.6 | |

The glass binders are prepared by conventional glass-making techniques, by mixing the desired components (or precursors thereof, e.g. $H_3BO_3$ for $B_2O_3$) in the desired proportions and heating the mixture to form a melt. As is well known in the art, heating is conducted to a peak temperature and for a time such that the melt becomes entirely liquid, yet gaseous evolution has ceased. The peak temperature is generally in the range 1100° C.–1500° C., usually 1200° C.–1400° C. The melt is then quenched by cooling the melt, typically by pouring onto a cold belt or into cold running water. Particle size reduction can then be accomplished by milling as desired.

Other transition metal oxides may also be employed as part of the inorganic binder, as is well known to those skilled in the art. Oxides or oxide precursors of zinc, cobalt, copper, nickel, manganese and iron are commonly used, particularly with substrates other than glass substrates, such as alumina substrates. These additives are known to improve soldered adhesion.

The inorganic binder can also contain up to approximately 4 parts by weight basis paste of a pyrochlore-related oxide having the general formula:

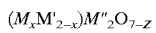

$$(M_xM'_{2-x})M''_2O_{7-z}$$

wherein

M is selected from at least one of Pb, Bi, Cd, Cu, Ir, Ag, Y and rare earth metals having atomic numbers of 57–71 and mixtures thereof, M' is selected from Pb, Bi and mixtures thereof, M" is selected from Ru, Ir, Rh and mixtures thereof, X=0–0.5, and Z=0–1.

Pyrochlore materials have been described in detail in U.S. Pat. No. 3,583,931, the disclosure of which is incorporated herein by reference. The pyrochlore materials act as adhesion promoters for the compositions of this invention. Copper bismuth ruthenate ($Cu_{0.5}Bi_{1.5}RU_2O_{6.75}$) is preferred.

Traditionally, conductive compositions have been based on lead frits. The elimination of lead from glass compositions to meet current toxicity and environmental regulations may limit the types of binder that can be used to achieve the desired softening and flow characteristics, while simultaneously meeting wettability, thermal expansion, cosmetic and performance requirements. U.S. Pat. No. 5,378,406, the disclosure of which is incorporated herein by reference, describes a series of low-toxicity lead-free glasses based upon the constituents $Bi_2O_3$, $Al_2O_3$, $SiO_2$, CaO, ZnO and $B_2O_3$, all of which may be used in the compositions of the present invention.

In a preferred embodiment of the invention, the frit is composition I in Table 1 herein.

The components (a) to (c) of the composition hereinbefore described will ordinarily be dispersed into a liquid vehicle to form a semi-fluid paste which is capable of being printed in a desired circuit pattern. The liquid vehicle may be an organic medium or may be aqueous-based. Preferably the liquid vehicle is an organic medium. Any suitably inert liquid can be used as an organic medium. The liquid vehicle should provide acceptable wettability of the solids and the substrate, a relatively stable dispersion of particles in the paste, good printing performance, dried film strength sufficient to withstand rough handling, and good firing properties. Various organic liquids with or without thickening agents, stabilising agents and/or other common additives are suitable for use in the preparation of the compositions of the present invention. Exemplary of the organic liquids which can be used are alcohols (including glycols); esters of such alcohols such as the acetates, propionates and phthalates, for instance dibutyl phthalate; terpenes such as pine oil, terpineol and the like; solutions of resins such as polymethacrylates of lower alcohols; or-solutions of ethyl cellulose in solvents such as pine oil and monobutyl ether of diethylene glycol. The vehicle can also contain volatile liquids to promote fast setting after application to the substrate.

A preferred organic medium is based on a combination of a thickener consisting of ethyl cellulose in terpineol (typically in a ratio of 1 to 9), optionally combined for instance with dibutyl phthalate or with the monobutyl ether of diethylene glycol (sold as butyl CARBITOL™). A further preferred organic medium is based on ethyl cellulose resin and a solvent mixture of alpha-, beta- and gamma-terpineols (typically 85–92% alpha-terpineol containing 8–15% beta and gamma-terpineol).

The ratio of liquid vehicle to solids in the dispersion can vary considerably and is determined by the final desired formulation viscosity which, in turn, is determined by the printing requirements of the system. Normally, in order to achieve good coverage, the dispersions will contain about 50 to about 95%, preferably about 60 to about 90%, by weight solids, and about 5 to about 50%, preferably about 10 to about 40%, by weight liquid vehicle, as noted above.

The compositions of the present invention may additionally comprise further additives known in the art, such as colorants and staining agents, rheology modifiers, adhesion enhancers, sintering inhibitors, green-state modifiers. surfactants and the like.

In the preparation of the compositions of the present invention, the particulate inorganic solids are mixed with the liquid vehicle and dispersed with suitable equipment, such as a three-roll mill or a power-mixer, according to conventional techniques well-known in the art, to form a suspension. The resulting composition has a viscosity generally in the range of about 10–500, preferably in the range of about 10–200, more preferably in the range of about 15–100 Pa.s at a shear rate of 4 $sec^{-1}$, for instance, as measured on a Brookfield HBT viscometer using #5 spindle at 10 rpm and 25° C. The general procedure for preparing the composition of the invention is set out below.

The ingredients of the paste are weighed together in a container. The components are then vigorously mixed by a mechanical mixer to form a uniform blend; then the blend is passed through dispersing equipment, such as a three-roll mill, to achieve a good dispersion of particles to produce a paste-like composition having a suitable consistency and rheology for application onto a substrate, for instance by screen-printing. A Hegnan gauge is used to determine the state of dispersion of the particles in the paste. This instrument consists of a channel in a block of steel that is 25 μm deep (1 mil) on one end and ramps up to zero depth at the other end. A blade is used to draw down paste along the length of the channel. Scratches appear in the channel where the agglomerates' diameter is greater than the channel depth. A satisfactory dispersion will give a fourth scratch point of typically 10–18 μm. The point at which half of the channel is uncovered with a well-dispersed paste is between 3 and 8 μm typically. Fourth scratch measurements of>20 μm and "half-channel" measurements of>10 μm indicate a poorly dispersed suspension.

The compositions are then applied to a substrate using conventional techniques known in the art, typically by the process of screen printing, to a wet thickness of about 20-60 μm, preferably about 35–50 μm. The compositions of this invention can be printed onto the substrates either by using an automatic printer or a hand printer in the conventional manner. Preferably, automatic screen printing techniques are employed using a 200- to 325-mesh per inch screen. The printed pattern is optionally dried at below 200° C., preferably at about 150° C., for a time period between about 30 seconds to about 15 minutes before firing. Firing to effect sintering of both the inorganic binder and the finely divided particles of metal is preferably done in a well-ventilated belt conveyor furnace with a temperature profile that will allow burn-off of the vehicle at about 200–500° C., followed by a period of maximum temperature of about 500–1000° C., preferably about 600–850° C., lasting for about 30 seconds to about 15 minutes. This is followed by a cooldown cycle, optionally a controlled cooldown cycle, to prevent oversintering, unwanted chemical reactions at intermediate temperatures or substrate fracture which can occur from too rapid cooldown. Alumina substrates are particularly susceptible to fracture resulting from too rapid cooldown. The overall firing procedure will preferably extend over a period of about 2–60 minutes, with about 1–25 minutes to reach the firing temperature, about seconds to about 10 minutes at the firing temperature and about 5 seconds to about 25 minutes in cooldown. For the manufacture of a toughened glass substrate, a controlled cooldown cycle is generally used wherein the overall firing procedure typically extends over a period of about 2 to 5 minutes, with about 1 to 4 minutes to reach the firing temperature, followed by a rapid cooldown.

Typical thicknesses of the thick-films after firing are from about 3 $\mu$m to about 40 $\mu$m preferably from about 8 $\mu$m to about 20 $\mu$m.

The compositions of the invention are primarily intended for use in the manufacture of heating elements in windows such as defogging or defrosting elements in automotive glazing, particularly backlights. The compositions may also be used to incorporate other conductive functions into the window, such as a printed aerial or antenna. However, the coating compositions can be employed in various other applications, including printed circuits and heating elements generally. For instance, the compositions of the present invention may be used as base plates in hot water heating appliances. There is a general need within the electronics and electrical industry for lower-cost heating elements, particularly screen-printable heating elements.

According to a further aspect of the invention, there is provided a composition comprising finely divided particles of (a) an electrically-conductive material; (b) one or more inorganic binders; and (c) tin, wherein components (a), (b) and (c) are dispersed in a liquid vehicle, preferably an organic medium, for use in the manufacture of an electrically-conductive pattern on a substrate.

According to a further aspect of the invention, there is provided a process for the preparation of a composition comprising finely divided particles of (a) an electrically-conductive material; (b) one or more inorganic binders; and (c) tin, said process comprising the step of dispersing components (a), (b) and (c) in a liquid vehicle, preferably an organic medium.

According to a further aspect of the invention there is provided a process for the manufacture of an electrically-conductive pattern, said process comprising applying to a substrate a composition comprising finely divided particles of (a) an electrically-conductive particles; (b) one or more inorganic binders; and (c) tin, said components (a), (b) and (c) being dispersed in a liquid vehicle, preferably an organic medium, and firing the coated substrate to effect sintering of the finely-divided particles to the substrate. Preferably the process is a screen printing process.

According to a further aspect of the present invention there is provided a substrate, typically a rigid substrate such as a glass (including toughened and laminated glass), enamel, enamel-coated glass, ceramic, alumina or metal substrate, having on one or more surfaces thereof an electrically-conductive pattern, said conductive pattern comprising (a) an electrically-conductive material; (b) one or more inorganic binders; and (c) tin.

The following test procedures were used to evaluate the compositions of the present invention.

Adhesion

Copper clips (obtained from Quality Product Gen. Eng. (Wickwar), UK) are soldered to the fired conductive pattern on a glass substrate (dimensions 10.2 cm×5.1 cm×3 mm) using a 70/27/3 Pb/Sn/Ag solder alloy at a soldering iron temperature of 350 to 380° C. A small quantity of a mildly active rosin flux, such as ALPHA 615-25® (Alpha Metals Limited, Croydon, UK) may be used to enhance solder wetting and to keep the solder and clip in place during assembly of parts, in which case the flux is applied to the solder using a shallow tray containing a thin film of fresh flux. Adhesion was measured on a CHATTILLON® pull tester Model USTM at a pull speed of 0.75±0.1 inches per minute (1.91±0.25 cm per minute) and the pull strength recorded at adhesion failure. The average value of adhesion failure over 8 samples was determined: The adhesion should preferably be greater than 10 kg, more preferably greater than 15 kg and more preferably greater than 20 kg. The principal failure modes of adhesion are as follows:

(a) clip separates from the conductive pattern (i.e. poor solder adhesion).

(b) the conductive pattern separates from the substrate (i.e. poor substrate adhesion).

(c) glass pullout/fracture (i.e. the bonding strengths between the clip and the conductive layer and between the conductive layer and the substrate is greater than the strength of the substrate).

(d) failure within the solder.

Resistance and Resistivity

The resistance of the fired conductive pattern on a glass substrate (dimensions 10.2 cm×5.1 cm×3 mm) was measured using a GenRad Model 1657 RLC bridge calibrated for use between 1 and 900 Ω or equivalent The thickness of the conductive layer is measured using a thickness measuring device such as a surf-analyser (e.g. TALYSURF™, which is a contact measuring device which analyses the surface of the substrate in 2 dimensions using a spring loaded stylus; any change in height will deflect the stylus and this change will then be registered on a recorder, such as a chart recorder; the difference between the base line and average height gives the print thickness). Resistance of the pattern is determined by placing the probe tips at the point where the conductive track meets the solder pads. The bulk resistivity (thickness-normalised) of the layer is determined by dividing the measured resistance for the pattern by the number of squares therein where the number of squares is the length of the conductive track divided by the width of the track. The resistivity value is obtained as mΩ/□ at any normalised thickness, typically 10 $\mu$m.

Particle Size

Particle size in the composition is measured according to ASTM D1210-79 using a large Hegman type fineness of grind gauge.

Chemical Durability

A solution of 1% glacial acetic acid in deionised water is used in this test. The glass substrate (50×100 mm) having thereon a fired conductive pattern was inserted into a plastic container half-filled with the test solution. The container is then sealed and left to stand at ambient temperature. The test substrates are removed after 96, 168 and 336 hours, dried and then analysed by a lift test. The lift test comprises application of a 0.75 inch (19.1 mm) wide masking tape (NICEDAY™) onto the substrate and then removing sharply in approximately ½ second. The results of the lift test are given as the approximate percentage of film area removed by the tape.

The invention will now be described with reference to the following examples. It will be appreciated that the examples are not intended to be limiting and modification of detail can be made without departing from the scope of the invention.

EXAMPLES

Series I

A first series of conductive patterns were prepared using the method hereinbefore described. The tin particles used were sub-325 mesh spheroid tin particles (the particle size distribution $D_{50}$ was 11.5 $\mu$m; (i.e. 50% of the particles are of a diameter below 11.5 $\mu$m). The silver particles were a mixture of 50% spherical silver particles (surface area of 0.80–1.40 $m^2g^{-1}$) and 50% flake silver particles (surface area 0.60–0.90 $m^2g^{-1}$). The glass used was Composition I in Table 1 herein. The liquid vehicle was ethyl cellulose in terpineol (in a ratio of 1 to 9) combined with the monobutyl ether of diethylene glycol (sold as butyl CARBITOL™). The substrate was a float glass (non-tempered) substrate. The fired film thickness was from 8 to 20 μm. All parts were fired through a belt furnace with a peak firing temperature of 660° C., unless otherwise specified, with the samples spending approximately 72 s at peak temperature. The total door-to door transit time in the furnace was approximately 21 minutes.

The resistivity, solder adhesion, chemical durability and resistance/firing temperature relationship of the patterns were measured as a function of composition in accordance with the procedures described above and the results are shown in Tables 2, 3 and 4 below.

TABLE 2

Adhesion Strength (W) and resistivity (ρ) as a function of composition

| Example | Silver (% w/w) | Glass (% w/w) | Tin (% w/w) | ρ (μΩ cm) | W (Kg) |
|---|---|---|---|---|---|
| A | 80 | 4 | 0.00 | 3.68 | 26 |
| B | 69.83 | 13.66 | 0.00 | 4.27 | 3 |
| C | 62.73 | 20.97 | 0.00 | 5.66 | 1 |
| D | 55.04 | 28.88 | 0.00 | 6.93 | 0 |
| E | 47.57 | 36.57 | 0.00 | 9.49 | 0 |
| F | 39.22 | 45.17 | 0.00 | 15.54 | 0 |
| G | 30.66 | 53.98 | 0.00 | 28.42 | 0 |
| 1 | 79.15 | 4.00 | 0.80 | 5.49 | 31 |
| 2 | 77.46 | 4.00 | 2.40 | 6.84 | 26 |
| 3 | 75.76 | 4.00 | 4.00 | 10.29 | 23 |
| 4 | 73.22 | 4.00 | 6.40 | 16.20 | 20 |
| 5 | 71.51 | 4.00 | 8.00 | 23.46 | 17 |
| 6 | 67.26 | 4.00 | 12.00 | 75.23 | 11 |
| 7 | 63.03 | 4.00 | 16.00 | 314.22 | 10 |
| 8 | 72.00 | 3.60 | 8.00 | 13.11 | 18 |
| 9 | 70.30 | 5.00 | 8.00 | 13.78 | 18 |
| 10 | 69.08 | 6.00 | 8.00 | 14.02 | 19 |
| 11 | 67.86 | 7.00 | 8.00 | 15.48 | 18 |
| 12 | 66.65 | 8.00 | 8.00 | 16.30 | 22 |
| 13 | 65.42 | 9.00 | 8.00 | 16.32 | 20 |
| 14 | 64.21 | 10.00 | 8.00 | 17.68 | 20 |
| 15 | 58.13 | 15.00 | 8.00 | 26.29 | 19 |

TABLE 3

Stability of resistance to variation of firing temperature as a function of composition

| Example | Silver (% w/w) | Glass (% w/w) | Tin (% w/w) | R (Ω) 620° C. | R (Ω) 640° C. | R (Ω) 660° C. | R (Ω) 680° C. | $\Delta R/R_{620}$ (%) |
|---|---|---|---|---|---|---|---|---|
| A | 80 | 4 | 0 | 3.47 | 3.27 | 3.13 | 3.15 | 9.3 |
| H | 53 | 25 | 0 | 10.03 | 9.32 | 9.10 | 8.91 | 11.2 |
| 1 | 40 | 37 | 0 | 16.80 | 17.28 | 18.29 | 10.30 | 38.7 |
| 2 | 77.46 | 4.00 | 2.40 | 3.76 | 3.74 | 3.66 | 3.44 | 9.0 |
| 4 | 73.22 | 4.00 | 6.40 | 9.71 | 9.97 | 10.07 | 9.85 | 1.4 |
| 8 | 72.00 | 3.60 | 8.00 | 9.18 | 8.62 | 8.74 | 8.47 | 7.7 |
| 9 | 70.30 | 5.00 | 8.00 | 10.96 | 10.54 | 10.42 | 10.25 | 6.5 |
| 10 | 69.08 | 6.00 | 8.00 | 11.56 | 11.07 | 10.66 | 10.61 | 8.2 |
| 12 | 66.65 | 8.00 | 8.00 | 13.26 | 12.57 | 12.19 | 12.01 | 9.4 |
| 13 | 65.42 | 9.00 | 8.00 | 14.30 | 13.49 | 12.92 | 12.76 | 10.8 |
| 14 | 64.21 | 10.00 | 8.00 | 16.32 | 15.40 | 14.19 | 14.44 | 11.5 |
| 15 | 58.13 | 15.00 | 8.00 | 25.13 | 23.52 | 21.90 | 21.73 | 13.5 |

TABLE 4

Chemical Durability as a function of composition

| Example | Silver (% w/w) | Glass (% w/w) | Tin (% w/w) | Acid durability (@ 96 hrs) | Acid durability (@ 168 hrs) | Acid durability (@ 336 hrs) |
|---|---|---|---|---|---|---|
| A | 80.00 | 4.00 | 0.00 | pass | fail | fail |
| 1 | 79.15 | 4.00 | 0.80 | pass | 70% | <95% |
| 2 | 77.46 | 4.00 | 2.40 | pass | 60% | <70% |
| 3 | 75.76 | 4.00 | 4.00 | pass | 40% | <50% |
| 4 | 73.22 | 4.00 | 6.40 | pass | 10% | <10% |
| 5 | 71.51 | 4.00 | 8.00 | pass | 5% | <10% |
| 6 | 67.26 | 4.00 | 12.00 | pass | pass | pass |
| 7 | 63.03 | 4.00 | 16.00 | pass | pass | pass |

The data demonstrate that the tin-containing compositions of the present invention have the following advantages in the preparation of conductive patterns:

(i) They allow the preparation of conductive patterns which exhibit increased resistivity while maintaining solder adhesion.

(ii) They allow the preparation of conductive patterns which, or a given increase in resistivity, exhibit a smaller variation of resistance with variation of firing temperature.

(iii) They allow the preparation of conductive patterns having a greater degree of chemical durability.

(iv) They allow the preparation of conductive compositions in which the resistivity versus the amount of resistivity modifier is more predictable and/or linear within the target range of desired resistivities.

Series II

A second series of conductive patterns was prepared by the method described for Series I except that the tin particles of Series I were replaced either with tin particles having a particle size distribution $D_{50}$ of 9.5 μm or with particles of tin/silver alloy (97% tin) having a particle size distribution $D_{50}$ of 9.5 μm. The properties of the conductive patterns were measured and the data are presented in Table 5 below.

TABLE 5

Adhesion strength and resistivity of tin-containing and tin/silver alloy-containing compositions

| Example | Silver (% w/w) | Glass (% w/w) | Tin (% w/w) | Alloy (% w/w) | ϱ (μΩ cm) | W (Kg) |
|---|---|---|---|---|---|---|
| 16 | 60.3 | 9.7 | 13.8 | — | 131 | 10 |
| 17 | 60.3 | 9.7 | — | 13.3 | 123 | 11 |

The data demonstrate that a tin/silver alloy allows the preparation of conductive patterns which exhibit increased resistivity while maintaining solder adhesion.

Series III

A third series of conductive patterns was prepared by the method described for Series I except that the tin particles of Series I were replaced with tin particles having a particle size distribution $D_{50}$ of 12.8 μm. The properties of the conductive patterns were measured and the data are presented in Table 6 below.

TABLE 6

Adhesion strength and resistivity of tin containing compositions

| Example | Silver (% w/w) | Glass (% w/w) | Tin (% w/w) | ϱ (μΩ cm) | W (Kg) |
|---|---|---|---|---|---|
| 18 | 61.57 | 11.47 | 9.47 | 38.45 | 14 |
| 19 | 57.85 | 15.00 | 8.90 | 50.12 | 14 |
| 20 | 57.23 | 15.60 | 8.80 | 58.83 | 18 |
| 21 | 55.76 | 16.99 | 8.58 | 61.07 | 20 |
| 22 | 53.47 | 19.17 | 8.22 | 68.46 | 19 |
| 23 | 51.76 | 20.79 | 7.96 | 89.48 | 16 |
| 24 | 49.40 | 23.04 | 7.60 | 115.58 | 13 |

The data provide further evidence that the tin-containing compositions of the present invention allow the preparation of conductive patterns which exhibit increased resistivity while maintaining solder adhesion.

What is claimed is:

1. A composition comprising finely divided particles of (a) an electrically-conductive material; (b) one or more inorganic binders; and (c) tin, wherein components (a), (b) and (c) are dispersed in a liquid vehicle and wherein component (c) comprises particles of a tin-containing alloy.

2. A composition according to claim 1 said tin-containing alloy is a tin/silver alloy containing between about 94 and 99% by weight tin.

3. A composition according to claim 1 wherein said electrically-conductive particles are silver particles.

4. A composition according to claim 1 wherein substantially all particles are in the range of 0.01 to 20 μm.

5. A composition according to claim 1 wherein the total amount of components (a), (b) and (c) is about 50 to about 95% by weight of the composition.

6. A composition according to claim 1 wherein component (a) is present in amounts of about 50 to about 98% by weight of the total solids present in the composition.

7. A composition according to claim 1 wherein component (b) is present in amounts of about 2 to about 25% by weight of the total solids present in the composition.

8. A composition according to claim 1 wherein component (c) is present in amounts of about 2 to about 20% by weight of the total solids present in the composition.

9. A composition according to claim 1 for use in the manufacture of an electrically-conductive pattern on a substrate.

10. A process for the manufacture of an electrically-conductive pattern, said process comprising the steps of applying to a substrate a composition comprising finely divided particles of (a) an electrically-conductive material; (b) one or more inorganic binders; and (c) tin, said components (a), (b) and (c) being dispersed in a liquid vehicle, wherein component (c) comprises particles of a tin-containing alloy, and then firing the coated substrate to effect sintering of the finely-divided particles to the substrate.

11. A process according to claim 10 wherein the composition is applied to the substrate by a screen-printing process.

12. An article comprising a substrate having on one or more surfaces thereof an electrically-conductive pattern, said conductive pattern comprising (a) an electrically-conductive material; (b) one or more inorganic binders; and (c) tin wherein component (c) comprises particles of a tin-containing alloy.

* * * * *